United States Patent [19]

Shiba et al.

[11] Patent Number: 4,937,649
[45] Date of Patent: Jun. 26, 1990

[54] SEMICONDUCTOR INTEGRATED CIRCUIT HAVING A CAPACITOR FOR STABILIZING A VOLTAGE AT A POWER SUPPLYING WIRING

[75] Inventors: Hiroshi Shiba; Hiroaki Mikoshiba, both of Tokyo, Japan

[73] Assignee: NEC Corporation, Tokyo, Japan

[21] Appl. No.: 383,292

[22] Filed: Jul. 17, 1989

Related U.S. Application Data

[63] Continuation of Ser. No. 96,359, Sep. 11, 1987, abandoned.

[51] Int. Cl.$^5$ ............................................. H01L 27/02
[52] U.S. Cl. ...................................... 357/51; 357/68; 357/71; 357/23.6; 357/40; 357/41; 357/55
[58] Field of Search .................... 357/51, 68, 71, 23.6, 357/40, 41, 55

[56]  References Cited

U.S. PATENT DOCUMENTS

| 4,249,196 | 2/1981 | Durney et al. | 357/51 |
| 4,455,568 | 6/1984 | Shiota | 357/23.6 |
| 4,583,111 | 4/1986 | Early | 357/68 |
| 4,675,717 | 6/1987 | Herrero et al. | 357/51 |
| 4,737,830 | 4/1988 | Patel et al. | 357/51 |

Primary Examiner—William Mintel
Attorney, Agent, or Firm—Helfgott & Karas

[57]  ABSTRACT

A semiconductor integrated circuit includes a semiconductor substrate, a plurality of logic gates formed in the semiconductor substrate, power source wiring and ground wiring formed on the semiconductor substrate to supply power source voltage to the logic gates and a capacitor formed on the semiconductor substrate and distributively connected between the power source wiring and the ground wirings.

9 Claims, 2 Drawing Sheets

SEMICONDUCTOR INTEGRATED CIRCUIT HAVING A CAPACITOR FOR STABILIZING A VOLTAGE AT A POWER SUPPLYING WIRING

This is a continuation, of application Ser. No. 096,359, filed September 11, 1987, now abandoned.

BACKGROUND OF THE INVENTION

1. Field of the Invention

This invention relates to a semiconductor integrated circuit, and particularly to an improvement for stabilizing a voltage at a power supply wiring.

2. Description of the Related Art

Recent semiconductor integrated circuits have a great number of logic gates on a single semiconductor chip. Each logic gate is formed of p- and n-channel MOS FET's to save power consumption but consumes the power during a short transition period when its electrical state changes to other electrical state. If a great number of logic gates change their electrical states, a large current flows through a power supply wiring, causing a change in voltage at the power supply wiring. Such voltage changes at the power supply wiring becomes large in accordance with a recent trend of increasing the number of logic gates on a single semiconductor chip.

For example, if respective logic gates have a mean load capacitance $C_L$ of 0.2 pF, a switching time tpd of 0.1 nS a power supply voltage of 5 volts, a current Icc flowing through each logic gate can be expressed as $$Icc = C_L \cdot Vcc/tpd \tag{1}$$

and is 10 mA. If, among 100,000 logic gates integrated on a single semiconductor chip, a hundredth of the whole logic gates, i.e. 1,000 logic gates, simultaneously change their electrical states, and instant peak current of 10 A flows through a power supply wiring on the semiconductor chip. Such large current produces a large voltage drop at the power supply wiring. Some of the logic gates malfunction in response to the large voltage drop. In the worst case, the large current generates an electromigration on the power supplying wirings or burns out the power supply wirings.

There has been proposed in Japanese Patent Application Examined Publication No. 49-393 which corresponds to Great Britain Pat. No. 1287110 to mount a concentrated capacitor element on a backsurface of an IC chip for suppressing power voltage change. The capacitor is effective for power supply wirings near a circuit point at which the capacitor is connected. The power supply wirings electrically far from the circuit point, however, still generate a voltage change. Furthermore, the large current still flows through the power supply wiring near the circuit point, because the concentrated element of capacitor only supplies additional current and does not have a function to distributively supply the additional current. The electromigration and the wiring-burnning-out are not prevented by the concentrated capacitor.

SUMMARY OF THE INVENTION

Therefore, a primary object of the present invention is to provide a semiconductor integrated circuit having an increased number of integrated circuit elements and having a capacitor connected to power wirings.

It is another object of the present invention to provide a semiconductor integrated circuit having an improved structure for power supply in which constant power voltage is kept throughout power wirings and maximum power current is decreased.

According to the present invention, there is provided a semiconductor integrated circuit comprising a semiconductor substrate, a plurality of logic gates formed in a semiconductor substrate, at least two power supply wirings formed on the semiconductor substrate and supply an operating power to the logic gates and a capacitor distributively connected between the two power supply wirings. The capacitor has a plurality of connections to each of the two power supply wirings. The connections are distributed at a rate of one for each logic gate or for ten to five hundred logic gates. The capacitor may be formed as a single capacitor having two conductive layers formed on the two power supply wirings and having a dielectric layer interposed therebetween or as an external chip-type capacitor. Alternatively, the capacitor may be formed by interposing a dielectric layer between the two power supply wirings.

In accordance with the present invention, since the capacitor is distributively connected between the power supply wirings, voltage swing becomes small at every portions thoughout the power supply wirings. All the logic gates perform a normal operation. Furthermore, since the transitional large currents are supplied to logic gates from their neighboring section of the capacitor, the total current supplied from power sources decreases. The electromigration of power supply wirings and the occurrence of burning out the power supply wirings become negligible so that the number of integrated logic gates can be increased.

BRIEF DESCRIPTION OF THE DRAWINGS

The above and further objects, features and advantages of the present invention will become more apparent from the following detailed description taken in conjunction with the accompanying drawings, wherein:

FIG. 1(a) is a view taken along X—X' in FIG. 1(b);

FIG. 3(a) is a view taken along Y—Y' in FIG. 3(b);

DESCRIPTION OF THE PREFERRED EMBODIMENTS

Figure 1A:
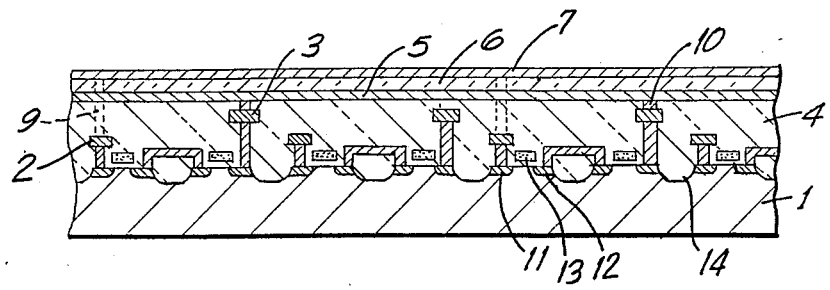
FIG. 1(a) is a partial section view of a first preferred embodiment of the present invention.
Figure 1B:
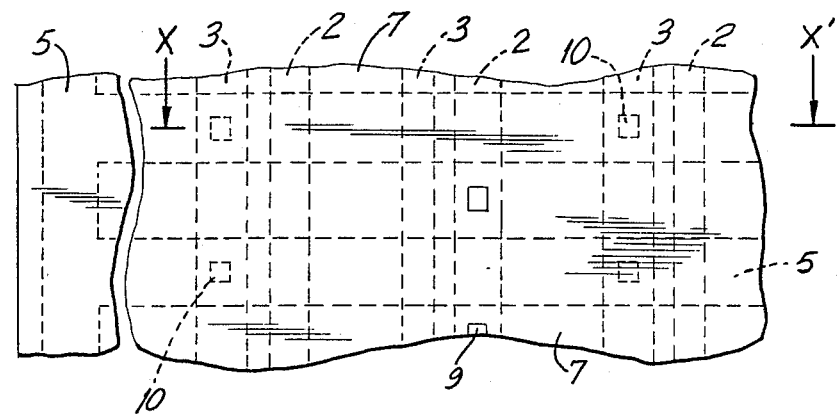
FIG. 1(b) is a partial plan view showing a relationship between the power source wiring, the ground wiring and upper metal layers of FIG. 1(a)

The first preferred embodiment has a single capacitor on a semiconductor substrate, as shown in FIGS. 1(a) and 1(b). A plurality of MOS FET's are formed on a silicon substrate 1. Each MOS FET has a source region 11, a drain region 12 and a polycrystalline silicon gate 13 between the source and drain regions 11 and 12 and is surrounded by a groove 14 for isolation from neighboring MOS FET's. A plurality of logic gates such as inverter gates are formed by, for example, connecting a drain region of one MOS FET and a source region of another MOS FET with wirings 8. The resulting whole surface is covered with silicon oxide layer 4. One source region in each logic gate is connected to a ground wiring 2. One drain region in each logic gate is connected to a power source wiring 3. The ground wiring 2 is connected to all inverter gates, but is connected to an uppermost metal layer 7 through conductive through-holes 9 at every 100 logic gates. Similarly, the power source wiring 3 is connected to another upper metal layer 5 through conductive through-holes 10 at every 100 logic gates. The metal layer 5 is formed in a form of comb, as shown in FIG. 1(b) to form spaces for the conductive through-holes 9. Fingers of the comb run perpendicularly to the ground wiring 2 and the power source wiring 3. A dielectric layer 6 of $Ta_2O_5$ is interposed between the metal layers 5 and 7 to form a capacitor. $Ta_2O_5$ has a dielectric constant of about 20. When the dielectric layer 6 has a thickness of 0.1 μm, the capacitor has a capacitance of about 2,000 pF/mm$^2$.

Figure 2:
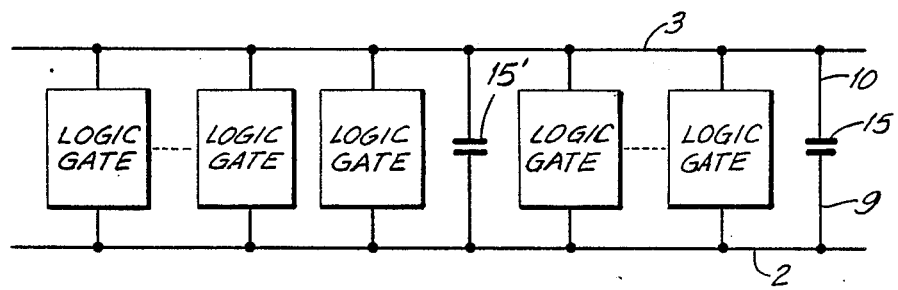
FIG. 2 is an equivalent circuit diagram of the first preferred embodiment.

The capacitor formed with the metal layers 5 and 7 and the dielectric layer 6 can be considered as a combination of a plurality of partial capacitors 15, 15' .... Therefore, the integrated circuit shown in FIGS. 1(a) and 1(b) can be expressed as an equivalent circuit shown in FIG. 2. The partial capacitors 15, 15' ... are added to every 100 logic gates by the conductive through-holes 9 and 10.

Transient large currents flowing through every 100 logic gates are supplied from neighboring partial capacitors 15, 15' .... Thus, the transient current becomes small. Additionally, the supplied transient current flows through short lengths of the power supply wirings 2 and 3. These facts causes a little voltage swing at any portion of the power supply wirings 2 and 3, to supply a stabilized power voltage to all the logic gates.

As another advantage, the metal layers 5 and 7 have a function of electro-magnetic shield. The logic gates covered with the metal layers 5 and 7 are not affected by external noise.

The fact that the transient current is supplied to every 100 logic gates from neighboring partial capacitors 15, 15' ... causes another advantage. When a large number of logic gates operate simultaneously, a large part of the transient large current is supplied from the partial capacitors 15, 15' .... In other words, the current supplied from external power source is smaller than the case where no capacitor or a concentrated capacitor is added to the power supply wirings 2 and 3. Therefore, there are few chances of electromigration in the power supply wirings 2 and 3. The chance of burning out the power supply wirings 2 and 3 is also decreased. Otherwise, the number of logic gates integrated in a single silicon chip can be increased.

Although the power supply wirings 2 and 3 are connected to the metal layers 5 and 7 at every 100 logic gates, the number of logic gates may be selected in a range from 10 to 500 to obtain similar effects. If the power supply wirings 2 and 3 can be connected to the metal layers 5 and 7 at every logic gate, the present invention is most effective, but the connections at every logic gate are not necessary to obtain sufficient effect. $Si_3N_4$ or other dielectric material may be replaced with $Ta_2O_5$ of the dielectric material 6.

Figure 3A:
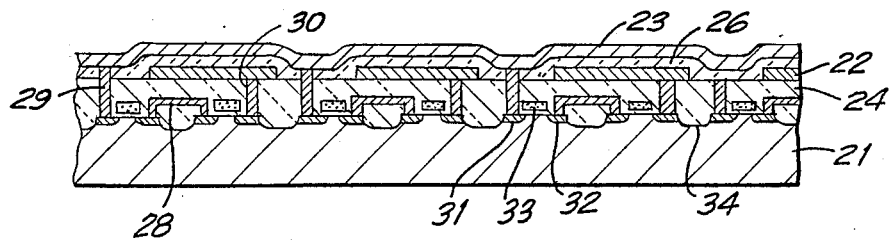
FIG. 3(a) is a partial sectional view of a second preferred embodiment of the present.
Figure 3B:
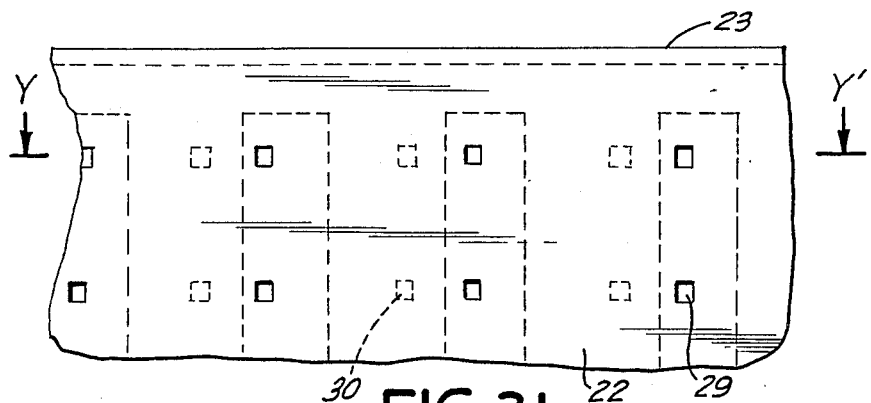
FIG. 3(b) is a partial plan view showing a relationship between the power source wiring and the ground wiring of FIG. 3(b)

The second preferred embodiment of the present invention uses power supply wirings as electrode metals of a capacitor, as shown in FIGS. 3(a) and 3(b). A plurality of MOS FET's are formed in a silicon substrate 21 with source regions 31, drain regions 32 and polycrystalline silicon gate electrodes 33. Some MOS FET's are connected by wirings 28 to form logic gates such as inverter gates. The resulting whole surface is covered with silicon oxide layer 24. A power source wiring 22 is formed in a form of comb, as shown in FIG. 3(b), having a plurality of fingers which are paralelly arranged. The power source wiring 22 is connected to one or more drain regions of MOS FET in every logic gate through conductive through-holes 30. A dielectric layer 26 of $Ta_2O_5$ having a thickness of 0.1 μm covers the power source wiring 22 and the exposed surface of the silicon oxide layer 24 and is covered with a ground wiring 23. The ground wiring 23 covers the whole surface of the silicon substrate except regions for wire-bonding. The ground wiring 23 is also connected to one or more source regions of MOS FET in every logic gate through conductive through-holes 29.

According to the second preferred embodiment, partial capacitors are added to every logic gate. Voltage swings at power supply wirings are more effectively suppressed, compared to the first preferred embodiment. The decrease of total current flowing through the power supply wirings and the shielding effect are also obtained, similar to the first preferred embodiment.

Figure 5A:
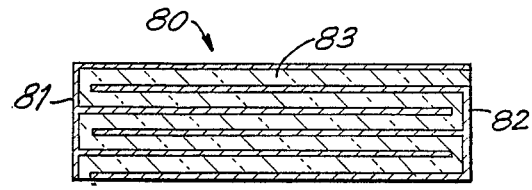
FIGS. 5(a) and 5(b) are respectively a sectional view and a bottom plan view of the chip-type capacitor employed in the third preferred embodiment of the present invention.
Figure 4:
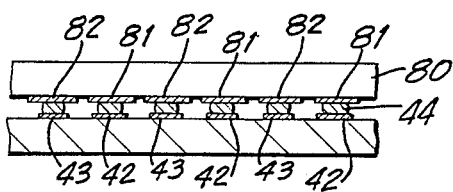
FIG. 4 is a partial sectional view of a third preferred embodiment of the present invention.
Figure 5B:
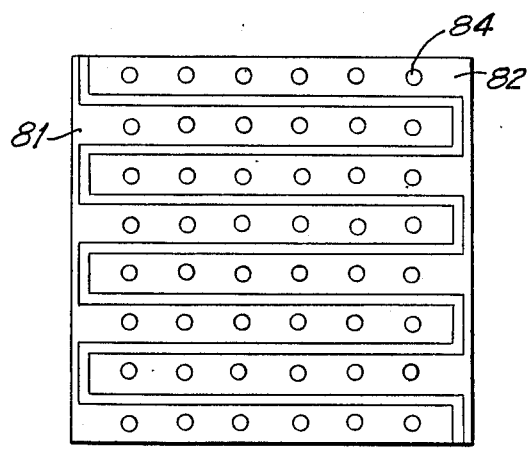

The third preferred embodiment uses a chip-type capacitor to be mounted on an integrated circuit device, as shown in FIGS. 4, 5(a) and 5(b). The integrated circuit device 41 may be any type. One example of the device 41 is a gate-array in which a plurality of logic gates are formed. Power supply wirings, i.e. a power source wiring 42 and a ground wiring 43 are formed on uppermost surface. Each power supply and ground wirings 42 and 43 has a form of comb. Fingers of the combs are alternatively arranged. On each finger a plurality of bump electrodes 44 are formed. The bump electrodes 44 are to be formed on every portion of the power supply and ground wirings 42 and 43 where 10 to 500 logic gates are connected.

A chip-type capacitor 80 has electrode layers 81 and 82 and large dielectric ceramics layer 83 interposed between the electrode layers 81 and 82, as shown in FIGS. 5(a) and 5(b). The dielectric ceramics may be barium titanate. $Si_3N_4$ or $Ta_2O_5$ may be used in place of the dielectric ceramics. The electrode layers 81 and 82 have a form of comb on a bottom surface of the chip-type capacitor 80. The comb's fingers of the electrode layers 81 and 82 are alternatively arranged to face the comb's finger's of the power supply and ground wirings 42 and 43 on the integrated circuit device 41.

The chip-type capacitor 80 is put on the integrated circuit device 41 to face the power source wiring 42 to the electrode layer 81 and the ground wiring 43 to the electrode layer 82. The circles 84 in FIG. 5(b) represent portions to be connected with bump electrodes 44 on the integrated circuit device 41. Under this condition, the assembly is subjected to anneal to connect the bump electrodes 44 and the electrode layers 81 and 82.

According to this third preferred embodiment of the present invention, the capacitance of the capacitor added between the power supply wirings 42 and 43 can be enlarged, irrespective of surface area of the integrated circuit device 41, by increasing number of piled dielectric layers 83 together with piled electrode layers 81 and 82. Therefore, the voltage swing on the power supply and ground wirings 42 and 43 may be avoided by using a chip-type capacitor 80 having a sufficiently large capacitance. The transient large current may also be sufficiently decreased.

As above-explained, the present invention improves the voltage swing on the power supply wirings' electromigration of the power wirings and possibility of burning out the power wirings by distributively adding capacitance to the power wirings.

What is claimed is:

1. A semiconductor integrated circuit comprising:
   a semiconductor substrate;
   a plurality of logic gates formed on said semiconductor substrate;
   a plurality of pairs of power and ground wirings formed on said semiconductor substrate, each of said pairs being provided for each one of said logic gates to supply power thereto;
   an insulator layer formed on said semiconductor substrate;
   a capacitor overlying said insulator layer and covering said power and ground wirings through said insulator layer, said capacitor being formed of a lower conductive layer distributed over substantially a whole surface of said semiconductor substrate, a dielectric film layer covering said lower conductive layer and an upper conductive layer formed on said dielectric film layer to cover substantially the whole surface of said semiconductor substrate;
   first means for connecting said power wirings to one of said lower and upper conductive layers, each of said power wirings being connected to a first connecting portion of said one of said lower and upper conductive layers, which is positioned directly upon respective power wirings; and
   second means for connecting said ground wirings to the other of said lower and upper conductive layers, each of said ground wirings being connected to a second connecting portion of said other of said lower and upper conductive layers, which is positioned directly upon respective ground wirings, whereby said power and ground wirings are electrically shielded from external noise.

2. A semiconductor circuit as claimed in claim 1, wherein said insulator layer is an insulation film formed over said power and ground wirings and having holes having said first and second means.

3. A semiconductor integrated circuit as claimed in claim 1, wherein said lower conductive layer is of a comb-like pattern and has a plurality of teeth to allow said second means to pass through spaces between said teeth.

4. A semiconductor integrated circuit comprising:
   a semiconductor substrate;
   a plurality of logic gates formed on said semiconductor substrate;
   a plurality of ground wirings formed on said semiconductor substrate via an insulator material to supply a ground potential to said logic gates, each of said ground wirings being provided for each of said logic gates;
   a plurality of power source wirings formed on said semiconductor substrate via said insulator material to supply a power voltage to said logic gates, each of said power source wirings being provided for each of said logic gates;
   an insulating film formed on said ground and power source wirings to overlie said wirings, said insulating film having first holes on said ground and power source wirings;
   a first metal layer formed on said insulating film to cover substantially a whole surface of said semiconductor substrate, said first metal layer having a comb-like pattern and being connected to said power source wiring with a plurality of first connecting means through said first holes on said power source wirings;
   a dielectric material layer of a dielectric material different from that of said insulator material, formed on said first metal layer, said dielectric material layer having second holes extending from said ground wirings, said second holes being formed so as to be separate from said first metal layer; and
   a second metal layer formed on said dielectric material layer to cover substantially a whole surface of said semiconductor substrate, said second metal layer being connected to said ground wirings with a plurality of second connecting means through said first holes on said ground wirings and said second holes.

5. A semiconductor integrated circuit as claimed in claim 2, wherein said dielectric film layer is made of tantalum oxide.

6. A semiconductor integrated circuit comprising:
   a semiconductor substrate;
   a plurality of logic gates formed on said semiconductor substrate;
   a plurality of pairs of power and ground wirings formed on said semiconductor substrate, each of said pairs being provided for each one of said logic gates to supply power thereto;
   an insulator layer formed on said semiconductor substrate;
   a capacitor superposed on said insulator layer, said power and ground wirings being surrounded by said insulator layer, said capacitor covering said wirings via said insulator layer and being formed of a lower conductive layer distributed over substantially a whole surface of said semiconductor substrate, a dielectric film layer covering said lower conductive layer, and an upper conductive layer formed on said dielectric film layer to cover substantially the whole surface of said semiconductor substrate;
   first means for connecting said power wirings to one of said lower and upper conductive layers, each of said power wirings being connected to a first connecting portion of said one of said lower and upper conductive layers, which is positioned directly upon respective wirings; and
   second means for connecting said ground wirings to the other of said lower and upper conductive layers, each of said ground wirings being connected to a second connecting portion of said other of said lower and upper conductive layers, which is positioned directly upon respective ground wirings.

7. A semiconductor circuit as claimed in claim 6, wherein said insulator layer is an insulation film formed to cover said power and ground wirings and having holes carrying said first and second means.

8. A semiconductor integrated circuit as claimed in claim 7, wherein said dielectric film layer is made of tantalum oxide.

9. A semiconductor integrated circuit as claimed in claim 6, wherein said lower conductive layer is of a comb-like pattern and has a plurality of teeth to allow said second means to pass through spaces between said teeth.

* * * * *

UNITED STATES PATENT AND TRADEMARK OFFICE
CERTIFICATE OF CORRECTION

PATENT NO. : 4,937,649

DATED : June 26, 1990

INVENTOR(S) : HIROSHI SHIBA et al.

It is certified that error appears in the above-identified patent and that said Letters Patent is hereby corrected as shown below:

ON TITLE PAGE: add the following:

[30] Foreign Application Priority Data

Sept. 12, 1986 [JP]   Japan.........216485/1986

Signed and Sealed this

Twenty-eighth Day of April, 1992

*Attest:*

HARRY F. MANBECK, JR.

*Attesting Officer*     *Commissioner of Patents and Trademarks*